United States Patent
Yang et al.

(10) Patent No.: US 9,071,242 B2
(45) Date of Patent: Jun. 30, 2015

(54) LEVEL SHIFTERS, METHODS FOR MAKING THE LEVEL SHIFTERS AND METHODS OF USING INTEGRATED CIRCUITS

(71) Applicant: TAIWAN SEMICONDUCTOR MANUFACTURING COMPANY, LTD., Hsinchu (TW)

(72) Inventors: Tien Chun Yang, San Jose, CA (US); Yuwen Swei, Fremont, CA (US); Chih-Chang Lin, San Jose, CA (US); Chiang Pu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/107,115

(22) Filed: Dec. 16, 2013

(65) Prior Publication Data

US 2014/0103967 A1 Apr. 17, 2014

Related U.S. Application Data

(62) Division of application No. 12/717,705, filed on Mar. 4, 2010, now Pat. No. 8,629,704.

(60) Provisional application No. 61/168,801, filed on Apr. 13, 2009.

(51) Int. Cl.
*H03K 3/00* (2006.01)
*H03K 19/0175* (2006.01)
(Continued)

(52) U.S. Cl.
CPC ... *H03K 19/017509* (2013.01); *Y10T 29/49117* (2015.01); *H03K 19/018521* (2013.01); *H05K 13/0023* (2013.01)

(58) Field of Classification Search
None
See application file for complete search history.

(56) References Cited

U.S. PATENT DOCUMENTS 4,717,836 A * 1/1988 Doyle ............................ 326/71
4,849,661 A * 7/1989 Bazes ............................ 326/71
(Continued)

FOREIGN PATENT DOCUMENTS

JP 7226670 8/1995
JP 8065142 3/1996
(Continued)

OTHER PUBLICATIONS

Veendrick, Harry J. M., "Short-Circuit Dissipation of Static CMOS Circuitry and Its Impact on the Design of Buffer Circuits", IEEE Journal of Solid-State Circuits, vol. Sc-19, No. 4, Aug. 1984, pp. 468-473.
(Continued)

*Primary Examiner* — Lincoln Donovan
*Assistant Examiner* — Khareem E Almo
(74) *Attorney, Agent, or Firm* — Lowe Hauptman & Ham, LLP (57) ABSTRACT

A method of making a level shifter includes coupling a driver stage between an input end and an output end, the driver stage comprising a first transistor and a second transistor. An inverter having an input is coupled with the input end. A third transistor having a gate end is coupled with an output of the inverter, the third transistor having a terminal coupled to a pumped voltage (VPP). Additionally, the method includes coupling a fourth transistor with the output end, the fourth transistor having a terminal coupled to the pumped voltage. A fifth transistor is coupled with the input end, the fifth transistor having a terminal coupled to the third and fourth transistors. A sixth transistor is coupled with the input end, the sixth transistor having a terminal.

20 Claims, 5 Drawing Sheets

(51) Int. Cl.
*H03K 19/0185* (2006.01)
*H05K 13/00* (2006.01)

(56) References Cited

U.S. PATENT DOCUMENTS

| | | | |
|---|---|---|---|
| 5,151,620 A * | 9/1992 | Lin | 326/71 |
| 5,304,867 A * | 4/1994 | Morris | 326/71 |
| 5,955,893 A * | 9/1999 | Chang et al. | 326/71 |
| 7,248,075 B2 * | 7/2007 | Min et al. | 326/80 |
| 7,525,367 B2 * | 4/2009 | Behrends et al. | 327/333 |
| 7,683,667 B2 * | 3/2010 | Kim | 326/63 |
| 2006/0132214 A1 * | 6/2006 | Chen | 327/333 |
| 2006/0164148 A1 * | 7/2006 | Davis | 327/333 |
| 2006/0214718 A1 * | 9/2006 | Chen | 327/333 |
| 2009/0108915 A1 * | 4/2009 | Liao | 327/536 |
| 2013/0082760 A1 * | 4/2013 | Umezaki | 327/404 |

FOREIGN PATENT DOCUMENTS

| | | |
|---|---|---|
| JP | 2000261305 | 9/2000 |
| JP | 2004112310 | 4/2004 |
| KR | 1020020045951 | 6/2002 |
| KR | 100407991 | 10/2002 |
| KR | 1020060013805 | 6/2006 |
| KR | 1020060095611 | 9/2006 |

OTHER PUBLICATIONS

Office Acton dated Aug. 27, 2013 from corresponding application No. TW 099111383.
Notice of Reasons for Refusal from corresponding application No. JP2010-092457 and Engl. Translation.
Notice of Decision for Patent dated Mar. 6, 2012 from corresponding application No. KR10-2010-0031991.

* cited by examiner

LEVEL SHIFTERS, METHODS FOR MAKING THE LEVEL SHIFTERS AND METHODS OF USING INTEGRATED CIRCUITS

PRIORITY CLAIM

The present application is a divisional of U.S. application Ser. No. 12/717,705, filed Mar. 4, 2010, which claims the priority of U.S. Provisional Application No. 61/168,801, filed Apr. 13 2009, both of which are incorporated herein by reference in their entireties.

TECHNICAL FIELD

The present disclosure relates generally to the field of semiconductor circuits, and more particularly, to level shifters, and methods for making the level shifters and, method of using integrated circuits.

BACKGROUND

Flash memories have been used in a variety of electronic applications. Flash memories can provide random access to stored data such as application programs. Data can be written to and read from flash memory cells many times. A typical flash memory cell is a modified MOS transistor with a stacked gate. The stacked gate comprises a control gate and a floating gate. The control gate is used to turn the transistor OFF and ON and to thereby control current flow from the drain to the source. The floating gate is placed between the control gate and the device channel. Charge can be injected into or out of the floating gate where it becomes trapped due to the isolation material that surrounds the floating gate. The threshold voltage of the flash transistor cell varies with the charge-state of the floating gate. Binary data values are stored in each flash cell based on the floating gate charge-state.

The process of charging or discharging the floating gate is called erasing or programming. Erasing or programming the flash cell requires that electrons overcome an energy barrier, such as caused by an oxide layer, between the floating gate electrode and the charge source. The energy level of the electrons is raised above this energy barrier value by forcing a relatively large voltage across the barrier. For example, the flash cell may be erased by injecting electrons from the floating gate into the control gate. The control gate is supplied with a large positive voltage while the floating gate is capacitively coupled to a low voltage or to a negative voltage. Similarly, the drain, the source, or the channel region of the device may be used to source or to sink electrons during programming and erasing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

The conventional Flash memory circuit has a level shifter. The conventional level shifter serves as a high voltage switch. The conventional level shifter consists of a driver stage, an NMOS transistor N1, a PMOS transistor P1, and an inverter. The NMOS transistor N1 and the PMOS transistor P1 are coupled in series and disposed parallel with the driver stage. The inverter is coupled between the NMOS transistor N1 and the driver stage. A source end of the PMOS transistor P1 is coupled with a high voltage HV. A source end of the NMOS transistor N1 is coupled with a low voltage VSS. If the input voltage signal is high, the high voltage HV is output at an output end of the stage driver. If the input voltage signal is low, the low voltage VSS is output at the output end of the stage driver.

The conventional driver stage consists of an NMOS transistor N2 and a PMOS transistor P2. The PMOS transistor P2 and the NMOS transistor N2 are coupled in series between the high voltage HV and the low voltage VSS. A source end of the PMOS transistor P2 is coupled with the high voltage HV. A source end of the PMOS transistor is coupled with the low voltage VSS. Drain ends of the NMOS transistor N2 and the PMOS transistor P2 serve as an output end of the level shifter. The output end of the level shifter is coupled with a gate of the PMOS transistor P1. The drain end of the PMOS transistor P1 is coupled with a gate of the PMOS transistor P2.

If the input voltage signal is high, the NMOS transistor N1 is turned on. The inverter inverts the high voltage state to a low voltage state, turning off the NMOS transistor N2. The turned-on NMOS transistor N1 couple the drain of the PMOS transistor P1 to the low voltage VSS. The low voltage VSS can turn on the PMOS transistor P2 coupling the high voltage HV to the output end of the level shifter.

If the input voltage signal transitions from the high voltage state to the low voltage state, the NMOS transistor N1 is turned off. Immediately thereafter, the low voltage state is applied to the inverter that inverts the low voltage state to the high voltage state. The high voltage state is applied to the gate of the NMOS transistor N2, turning on the NMOS transistor N2. While the high voltage state is applied to the gate of the NMOS transistor N2, the low voltage state is still applied to the gate of the PMOS transistor P2. It is found that the NMOS transistor N2 and the PMOS transistor P2 are fully turned on. The fully turned-on NMOS transistor N2 and PMOS transistor P2 result in a high leakage current flowing from the high voltage HV to the low voltage VSS. Even though a time period for the fully turned-on may be short, charges flowing through the fully turned-on PMOS transistor P2 and NMOS transistor N2 are not desired due to the large leakage current. The charge loss may pull down the high voltage HV, disturbing high-voltage operations of various devices, transistors, and/or circuits of the Flash memory.

Based on the foregoing, level shifters, integrated circuits, systems, and method for operating the level shifter having a desired charge loss are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
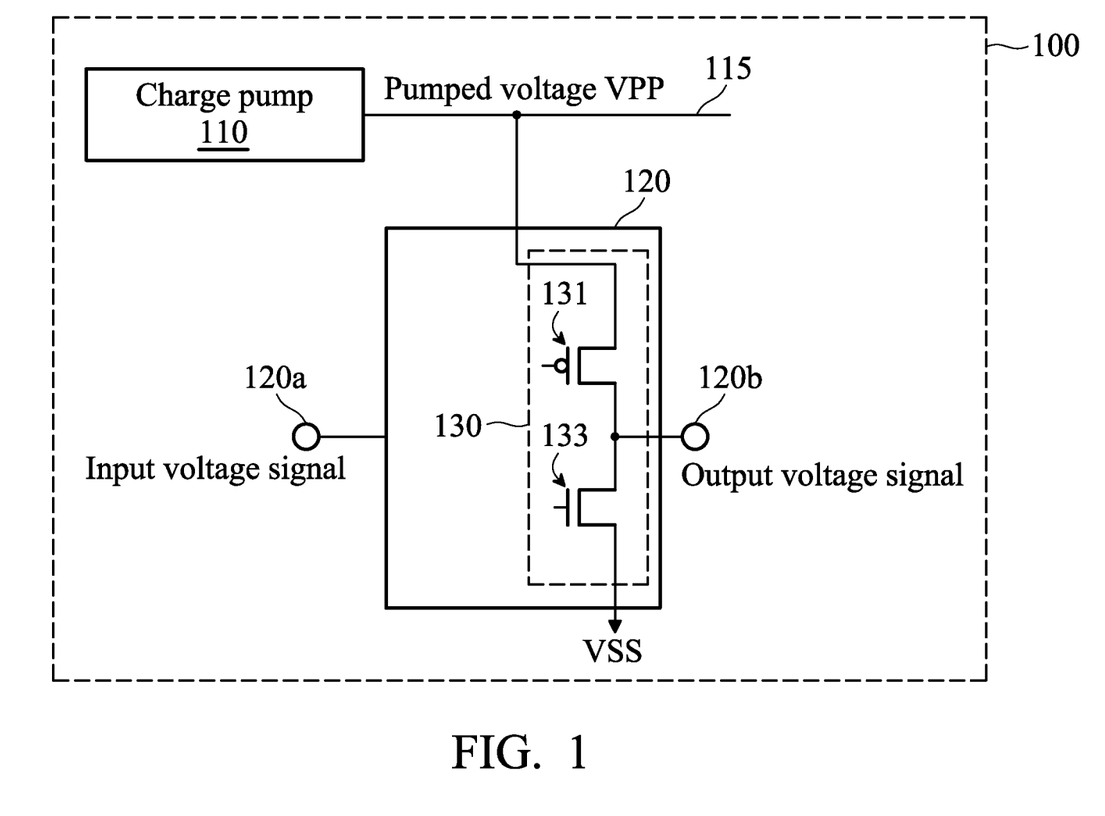
FIG. 1 is a schematic drawing illustrating an exemplary integrated circuit.

FIG. 1 is a schematic drawing illustrating an exemplary integrated circuit. In FIG. 1, an integrated circuit 100 can include a charge pump 110, a line 115, and a level shifter 120. The charge pump 110 can be coupled with the line 115. The line 115 can be coupled with the level shifter 120. The integrated circuit 100 can include a non-volatile memory circuit, e.g., FLASH, EPROM, E²PROME, a static random access memory (SRAM) circuit, an embedded SRAM circuit, dynamic random access memory (DRAM) circuit, an embedded DRAM circuit, a field-programmable gate array circuit, a logic circuit, and/or other integrated circuit.

The charge pump 110 can pump a voltage from a voltage state to another voltage state. For some embodiments using a Flash memory circuit, the charge pump 110 may pump an internal operating voltage VDD of about, e.g., 1.8 V, to about a pumped voltage VPP, e.g., about 10 V to about 13 V. The line 115 can transmit the pumped voltage VPP to various devices, transistors, diodes, and/or circuits within the integrated circuit 120 for high-voltage operations.

Referring to FIG. 1, the line 115 can couple the pumped voltage VPP to the level shifter 120 as a high voltage input. The level shifter 120 can include an input end 120a, an output end 120b, and a driver stage 130. The input end 120a can receive an input voltage signal. The input voltage signal can transition from a voltage state, e.g., a high state or VDD, to another voltage state, e.g., a low state or 0 V, during a transitional period. The output end 120b can output an output voltage signal. The output voltage signal can transition from a high voltage state, e.g., the pumped voltage VPP on the line 115, to a voltage state, e.g., VSS or ground, corresponding to the input voltage signal received at the input end 120a. As noted, in some embodiments, the level shifter 120 may output the pumped voltage VPP at the output end 120b if the input voltage signal at the input end 120a is high. The level shifter 120 may output the low voltage state VSS at the output end 120b if the input voltage signal at the input end 120a is low.

The driver stage 130 can be coupled between the input end 120a and the output end 120b. The driver stage 130 can include a first transistor, e.g., transistor 131, and a second transistor, e.g., transistor 133. Each of the transistors 131 and 133 can have a gate, a source end, and a drain end. The source end of the transistor 131 can be coupled with the line 115 providing the pumped voltage VPP. The source end of the transistor 133 can be coupled with a voltage source, e.g., ground or VSS. The drain ends of the transistors 131 and 133 can be coupled to each other and with the output end 120b of the level shifter 120.

Figure 2:
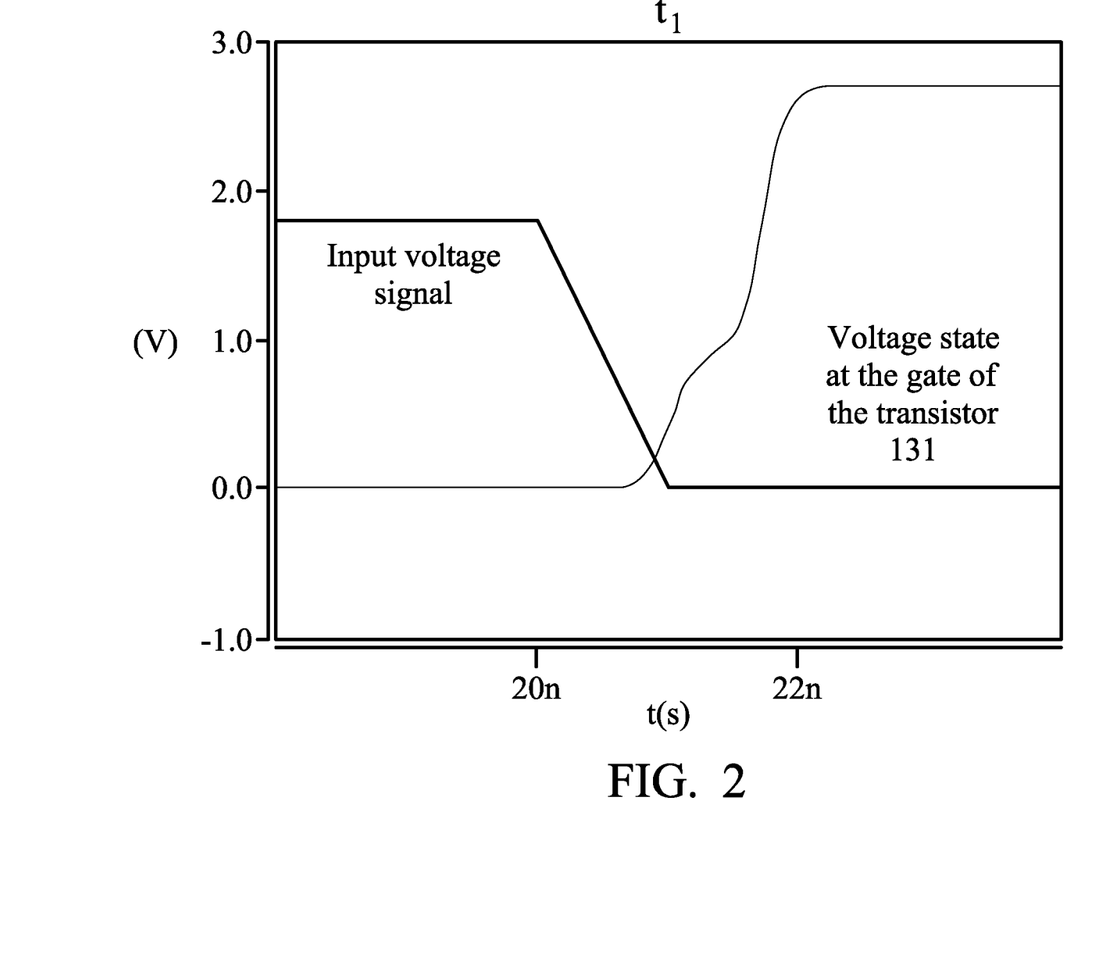
FIG. 2 is a simulation result illustrating state transitions of an input voltage signal and a voltage state applied to a gate of the first transistor of the driver stage.

Substantially immediately from a time $t_1$ corresponding to about a mean of the voltage levels of the first voltage state and the second voltage state, e.g., ½ VDD (shown in FIG. 2), the second voltage state, e.g., 0 V, is substantially free from being applied to a gate of the transistor 131 so as to substantially turn off the transistor 131. FIG. 2 is a simulation result illustrating state transitions of an input voltage signal and a voltage state applied to a gate of the first transistor of the driver stage. In FIG. 2, the input voltage signal transitions from the high state, e.g., VDD, to the low state, e.g., 0 V. At the time $t_1$, the voltage state of the input voltage signal can transition to about ½ VDD. Substantially immediately from the time $t_1$, the voltage state applied to the gate of the transistor 131 starts arising from the low voltage state, e.g., 0 V, towards the high voltage state, e.g., VDD, to turn off the transistor 131. In some embodiments, the phrase "substantially immediately from the time $t_2$" means about 1 nanosecond (ns) or less after the time $t_1$. In some other embodiments, the phrase "substantially immediately from the time $t_1$" means about 0.5 nanosecond (ns) or less after the time $t_1$.

As noted, the conventional level shifter has the driver stage including the PMOS transistor P2 and the NMOS transistor N2. If the input voltage is high, the PMOS transistor P2 is turned on. If the input voltage signal transitions from VDD to 0 V, the voltage state VDD has been applied to the gate of the NMOS transistor N2, while the voltage state 0 V is still applied to gate of the PMOS transistor P2. The NMOS transistor N2 and the PMOS transistor P2 are thus fully turned on. Even if the period of fully turning on the PMOS transistor P2 and the NMOS transistor N2 is short, the leakage current flows from the high voltage HV to the low voltage VSS is large, e.g., about 1.5 milliamp (mA). In some embodiments using 0.18-μm CMOS transistors and 2.7-V pumped voltage, the leakage current may result in a charge loss of about 1 pico coulomb (pC). The charge loss may substantially pull down the high voltage HV, disturbing the high-voltage operations of the devices, transistors, and/or circuits.

Figure 3:
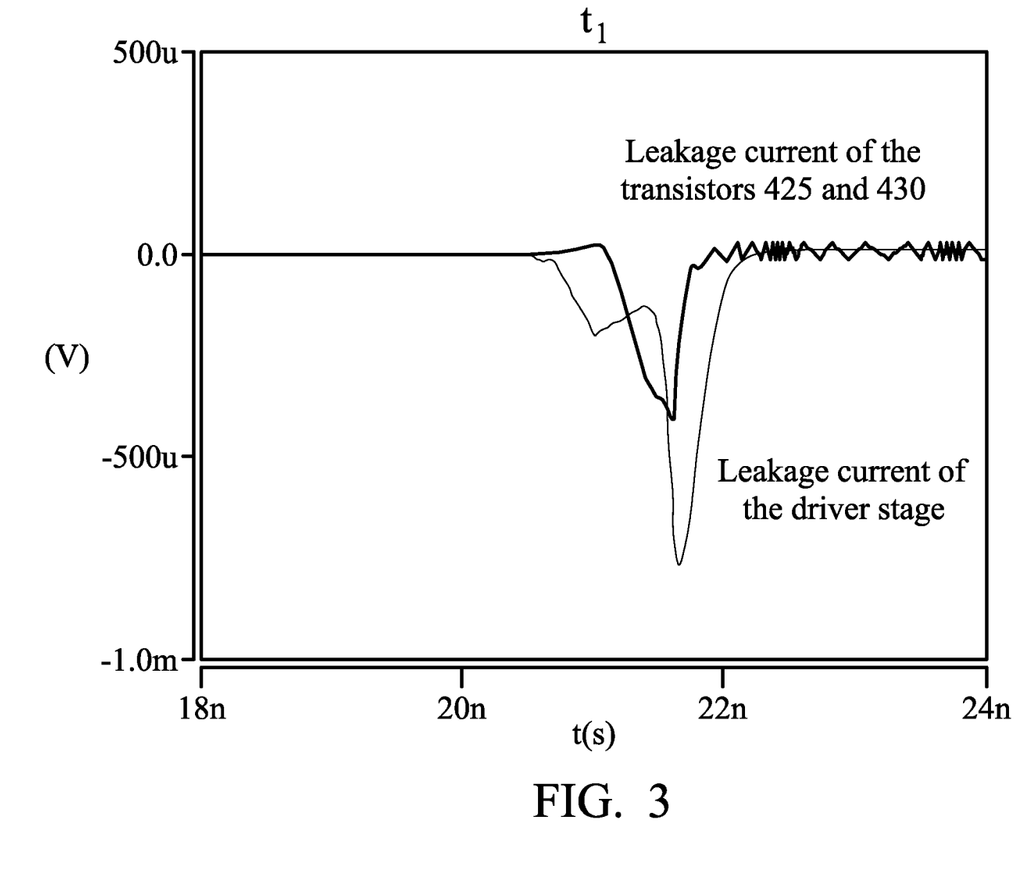
FIG. 3 is a simulation result illustrating leakage currents of an exemplary level shifter.

In contrary to the conventional level shifter, the level shifter 120 can substantially free from applying the low voltage state 0 to the gate of the transistor 131 substantially immediately from the time $t_1$ corresponding to the voltage state of about ½ VDD. Substantially immediately after the time $t_1$, the gate of the transistor 131 is free from seeing the voltage state 1V, while the gate of the transistor 133 is seeing the voltage state VDD. Since both of the transistors 131 and 133 are free from being simultaneously fully turned on after the time $t_1$, the leakage current flowing from the line 115 to the low voltage VSS is desirably small, e.g., about 0.8 mA or less. In some embodiments using a 2.7-V pumped voltage and 0.18-μm CMOS technology, the charge loss corresponding to the high-to-low transition of the input voltage signal may be about 0.5 pC after the time $t_1$ (shown in FIG. 3). It is noted that the charge loss of about 0.5 pC is merely exemplary. One of skill in the art can modify the pumped voltage and/or size of the transistors 131 and 133 to desirably reduce the charge lose. The scope of the invention is not limited thereto.

It is noted that the transition states of the input and output voltage signals described above in conjunction with FIGS. 1-3 are merely exemplary. It is also noted that the voltage states VDD, VSS, VPP, and/or 0 V are merely exemplary. One of skill in the art can modify the transitions of the input and output voltage signals and/or the voltage states to achieve a desired operation of the level shifter.

Figure 4:
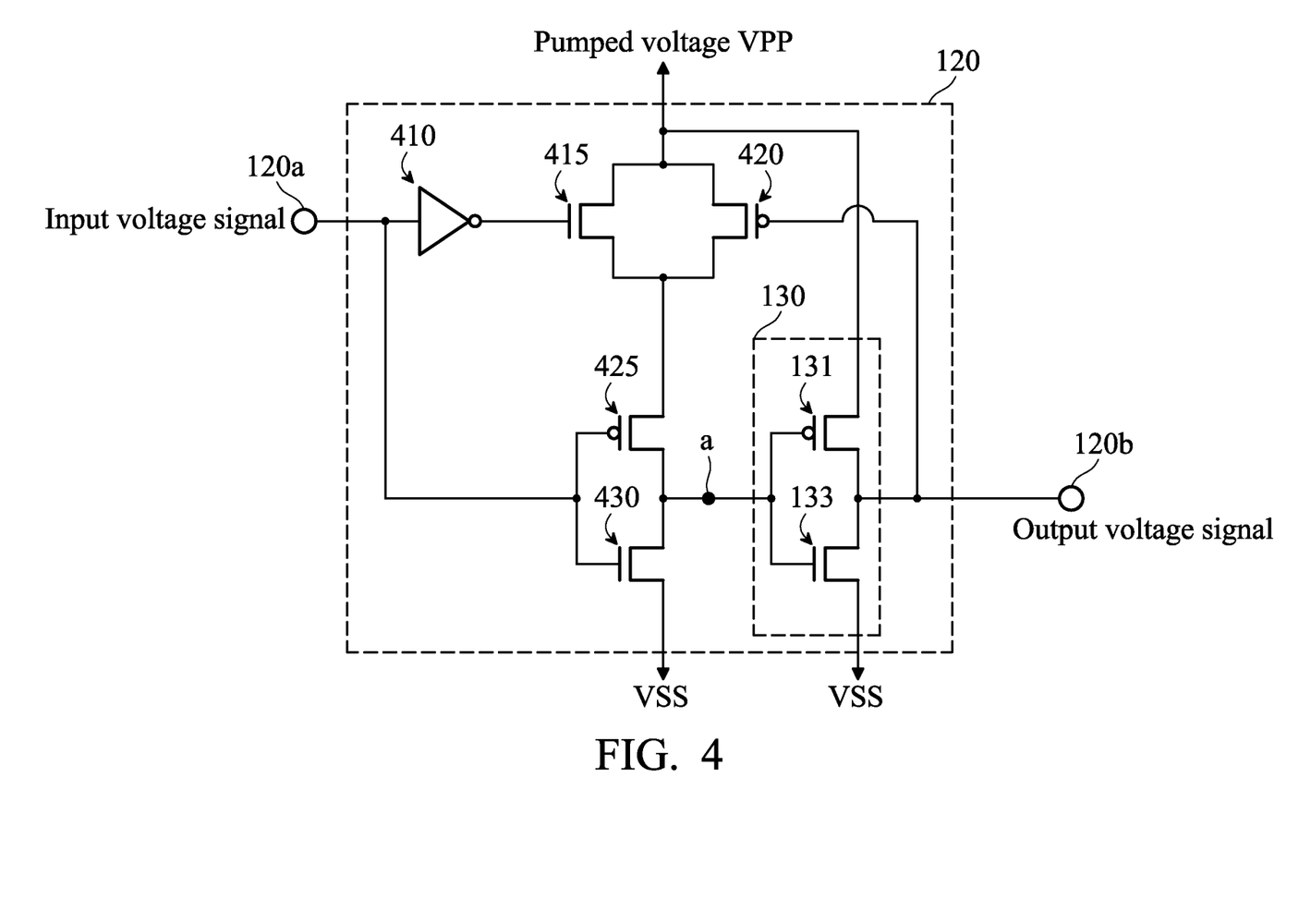
FIG. 4 is a schematic drawing illustrating an exemplary level shifter.

FIG. 4 is a schematic drawing illustrating an exemplary level shifter. In FIG. 4, the level shifter 120 can include an inverter, e.g., inverter 410, which is coupled with the input end 120a. A third transistor, e.g., transistor 415, can be coupled with the inverter 410. The transistor 415 can have a drain end and a source end. The drain end of the transistor 415 can be coupled with the line 115 (shown in FIG. 1) having the pumped voltage VPP.

The level shifter 120 can include a fourth transistor, e.g., transistor 420, which can be coupled with the output end 120b. The transistor 420 can have a drain end and a source end. The source end of the transistor 420 can be coupled with the line 115 (shown in FIG. 1) having the pumped voltage VPP.

The level shifter 120 can include a fifth transistor, e.g., transistor 425. The transistor 425 can be coupled with the input end 120a. The transistor 425 can have a drain end and a source end. The source end of the transistor 425 can be coupled with the transistors 415 and 420.

The level shifter 120 can include a sixth transistor, e.g., transistor 430, which can be coupled with the input end 120a. The transistor 430 can have a drain end and a source end. The drain end of the transistor 430 can be coupled with the drain end of the transistor 425 and the gates of the transistors 131 and 133 of the driver stage 130.

Following is a description regarding an exemplary operation of the level shifter 120. If the input voltage signal at the input end 120a is high, e.g., a voltage state VDD, the voltage state VDD can turn off the transistor 425 and turn on the transistor 430. The turned-on transistor 430 can couple a node "a" to a low voltage state, e.g., VSS or ground. As shown in FIG. 4, the node "a" can be coupled with the gates of the transistors 131 and 133 and the gates of the transistors 131 and 133 are coupled to each other. The voltage state VSS can be coupled to the gates of the transistors 131 and 133, turning off the transistor 133 and turning on the transistor 131. The turned-on transistor 131 can couple the pumped voltage VPP to the output end 120b of the level shifter 120. The pumped voltage VPP, e.g., about 10 V to about 13 V, can be output at the output end 120b.

If the input voltage signal transitions from the voltage state VDD to the low voltage state, e.g., 0 V, the voltage state 0 V can turn off the transistor 430 and turn on the transistor 425. As noted, the inverter 410 can inverter the voltage state 0 V to the voltage state VDD. The voltage state VDD can turn on the transistor 415. The turned-on transistors 415 and 425 can desirably couple the pumped voltage VPP to the node "a" to the gates of the transistors 131 and 133. The pumped voltage VPP can turn off the transistor 131 and turn on the transistor 133. The turned-on transistor 133 can couple the output end 120b and a gate of the transistor 420 to VSS. The voltage state VSS can turn on the transistor 420. The turned-on transistor 420 can help to pull up the voltage at the node "a" towards the pumped voltage.

Referring to FIGS. 2 and 4, when the input voltage signal transitions from the voltage VDD to ½ VDD or below, the transistor 425 may start turning on. The voltage state output from the inverter 410 may also start turning on the transistor 415. Substantially immediately after the time $t_1$, the voltage state at the node "a" may start being pulled up towards the pumped voltage VPP. The pulled-up voltage state at the node "a" may start turning on the transistor 133 and turning off the transistor 131. Since the same pulled-up voltage state is applied to the gates of the transistors 131 and 133, the gate of the transistor 131 is free from seeing the voltage state VDD while the gate of the transistor 133 is seeing the voltage state 0 V. The transistors 131 and 133 are free from being simultaneously fully turned on. The leakage current flowing from the pumped voltage VPP to the voltage VSS is thus reduced. The charge loss resulting from the leakage current can be lowered to a level that may not substantially pull down the pumped voltage state of the line 115.

It is noted that the type and number of the transistors 415-430 and the inverter 410 described above in conjunction with FIG. 4 are merely exemplary. For example, additional inverters may be added to change the states of the voltage signals. Additional transistors may be added to desirably control the leakage current flowing through the driver stage 130. One of skill in the art will be able to modify the type and number of the transistors 415-430 and the inverter 410 to achieve a desired level shifter.

Figure 5:
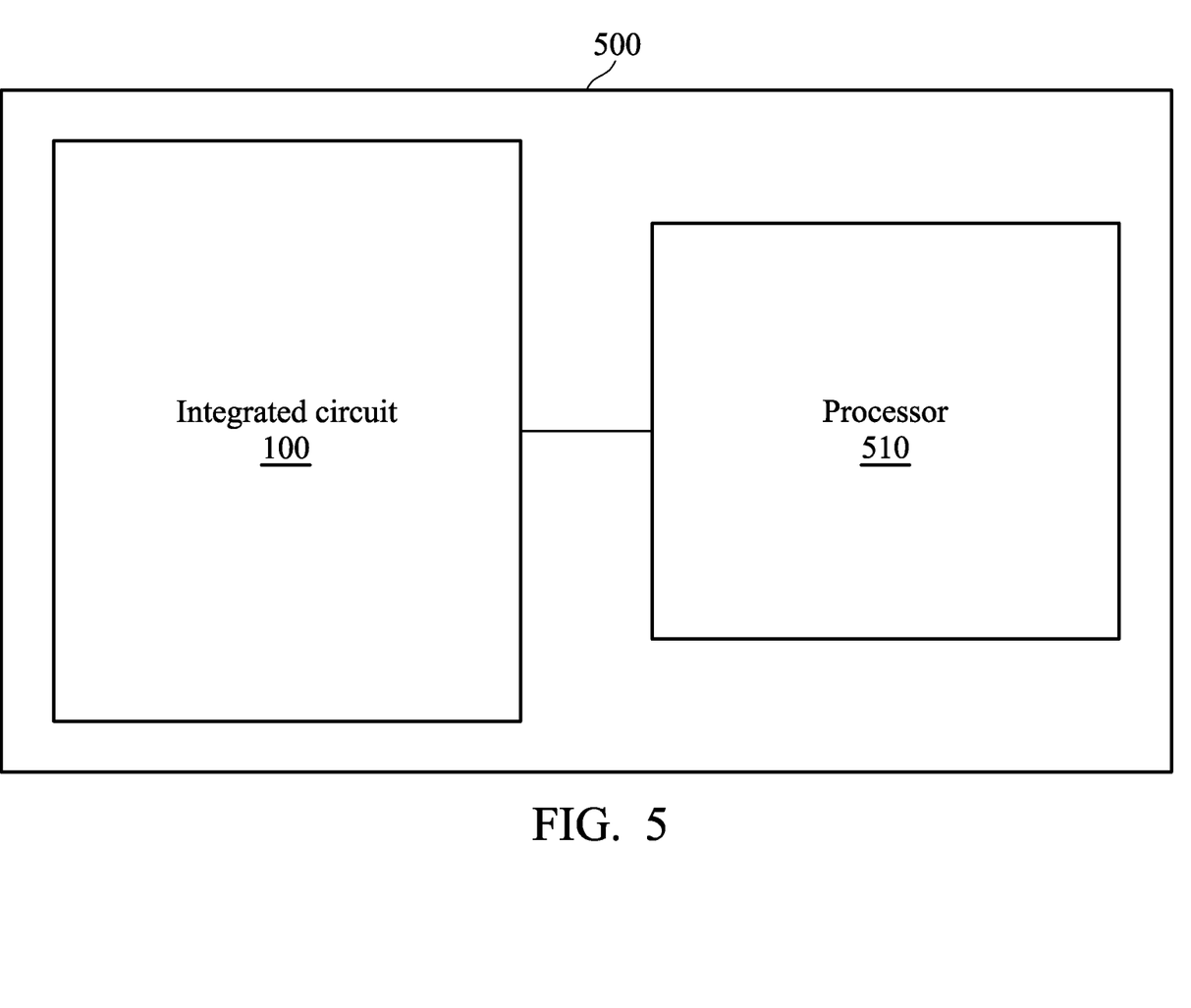
FIG. 5 is a schematic drawing showing a system including an exemplary integrated circuit.

FIG. 5 is a schematic drawing showing a system including an exemplary memory circuit. In FIG. 5, a system 500 can include a processor 510 coupled with the integrated circuit 100. In some embodiments, the processor 510 can be a processing unit, central processing unit, digital signal processor, or other processor that is suitable for accessing data of memory circuit.

In some embodiments, the processor 510 and the integrated circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 500 including the integrated circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates to a method of making a level shifter. The method of making a level shifter includes coupling a driver stage between an input end and an output end, the driver stage comprising a first transistor and a second transistor. An inverter having an input is coupled with the input end. A third transistor having a gate end is coupled with an output of the inverter, the third transistor having a terminal coupled to a pumped voltage (VPP). Additionally, the method includes coupling a fourth transistor with the output end, the fourth transistor having a terminal coupled to the pumped voltage. A fifth transistor is coupled with the input end, the fifth transistor having a terminal coupled to the third and fourth transistors. A sixth transistor is coupled with the input end, the sixth transistor having a terminal.

Another aspect of this description relates to a method of using an integrated circuit. The method includes receiving an input signal at an input end of the integrated circuit. A power source is selectively electrically coupled to a power node of an input stage based on the input signal. Additionally the method includes a node selectively electrically coupled with a switching device through the input stage based on the input signal. The power source is selectively electrically coupled to an output end through a driver stage based on a signal on the node.

Still another aspect of this description relates to a level shifter. The level shifter includes an input stage arranged to be coupled between an input end and a node. A driver stage is arranged to be coupled between the node and an output end where the driver stage includes a first transistor and a second transistor. Additionally, the level shifter includes a third transistor including a gate end coupled to the input end. A first terminal is coupled to the input stage, and a second terminal is coupled to a pumped voltage. Furthermore, the level shifter includes a fourth transistor which includes a gate end coupled to the output end, a first terminal coupled to the input stage, and a second terminal coupled to the pumped voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a level shifter comprising:
   coupling a driver stage between an input end and an output end, the driver stage comprising a first transistor and a second transistor;
   coupling an inverter with the input end, the inverter having an input and an output;
   coupling a third transistor with an output of the inverter, the third transistor having a terminal and a gate end, the terminal of the third transistor being coupled to a pumped voltage (VPP);
   coupling a fourth transistor with the output end, the fourth transistor having a terminal, the terminal of the fourth transistor being coupled to the pumped voltage;
   coupling a fifth transistor with the input end, the fifth transistor having a terminal, the terminal of the fifth transistor being coupled to the third and fourth transistors; and
   coupling a sixth transistor with the input end, the sixth transistor having a terminal.

2. The method of claim 1, further comprising coupling the gate of the first transistor with the gate of the second transistor.

3. The method of claim 1, further comprising coupling a source end of the first transistor with the pumped voltage.

4. The method of claim 1, further comprising coupling a drain end of the fifth transistor with the terminal of the sixth transistor.

5. The method of claim 4, further comprising coupling the terminal of the sixth transistor to a gate of the first transistor and a gate of the second transistors.

6. The method of claim 1, further comprising coupling a drain of the first transistor with the output end.

7. The method of claim 1, further comprising coupling a drain of the second transistor with the output end.

8. A method of using an integrated circuit comprising:
   receiving an input signal at an input end of the integrated circuit;
   selectively electrically coupling a power source to a power node of an input stage through a first switching device based on the input signal;
   selectively electrically coupling the power source to the power node of the input stage through a second switching device based on an output signal at an output end of the integrated circuit;
   selectively electrically coupling a node with the power node through the input stage based on the input signal; and
   selectively electrically coupling the power source to the output end of the integrated circuit through a driver stage based on a signal on the node.

9. The method of claim 8, further comprising outputting an output signal from the output end.

10. The method of claim 8, wherein receiving the input signal at the input end comprises receiving an operating voltage (VDD) or a ground voltage (VSS).

11. The method of claim 8, further comprising flowing a charge leakage corresponding to a first state transition through the input stage, wherein the charge leakage is about 0.5 pico coulomb (pC) or less from a time the input signal has a value equal to about the mean of a first voltage state and a second voltage state.

12. The method of claim 8, further comprising operating the power source at a voltage higher than the input voltage.

13. The method of claim 12, further comprising operating the power source at the voltage comprising the voltage ranging from about 10 Volts (V) to about 13 V.

14. A level shifter comprising:
    an input stage arranged to be coupled between an input end and a node;
    a driver stage arranged to be coupled between the node and an output end, the driver stage comprising a first transistor and a second transistor;
    a third transistor comprising:
      a gate end coupled to the input end;
      a first terminal coupled to the input stage; and
      a second terminal coupled to a pumped voltage;
    and
    a fourth transistor comprising:
      a gate end coupled to the output end;
      a first terminal coupled to the input stage; and
      a second terminal coupled to the pumped voltage.

15. The level shifter of claim 14, further comprising an inverter coupled between the third transistor and the input end.

16. The level shifter of claim 14, wherein the input stage comprises a first PMOS transistor and a first NMOS transistor coupled in series;
    the first PMOS transistor having a gate coupled to the input end and the first NMOS transistor having a gate coupled to the input end; and
    the first NMOS transistor connected to the first PMOS transistor at the node.

17. The level shifter of claim 16, wherein the first transistor is a second PMOS, and the second transistor is a second NMOS;
    the second PMOS transistor having a gate coupled to the node and the second NMOS transistor having a gate coupled to the node; and
    the second NMOS transistor connected to the second PMOS transistor at the output end.

18. The level shifter of claim 14, wherein the first transistor and the second transistor are configured to flow a charge leakage corresponding to a first state transition.

19. The level shifter of claim 14, wherein the input end is configured to receive an input voltage signal, the input voltage signal being capable of transitioning from a first voltage state to a second voltage state during a transitional period.

20. The level shifter of claim 14, wherein the third transistor is an NMOS transistor, and the fourth transistor is a PMOS transistor.

* * * * *